Figure 1:
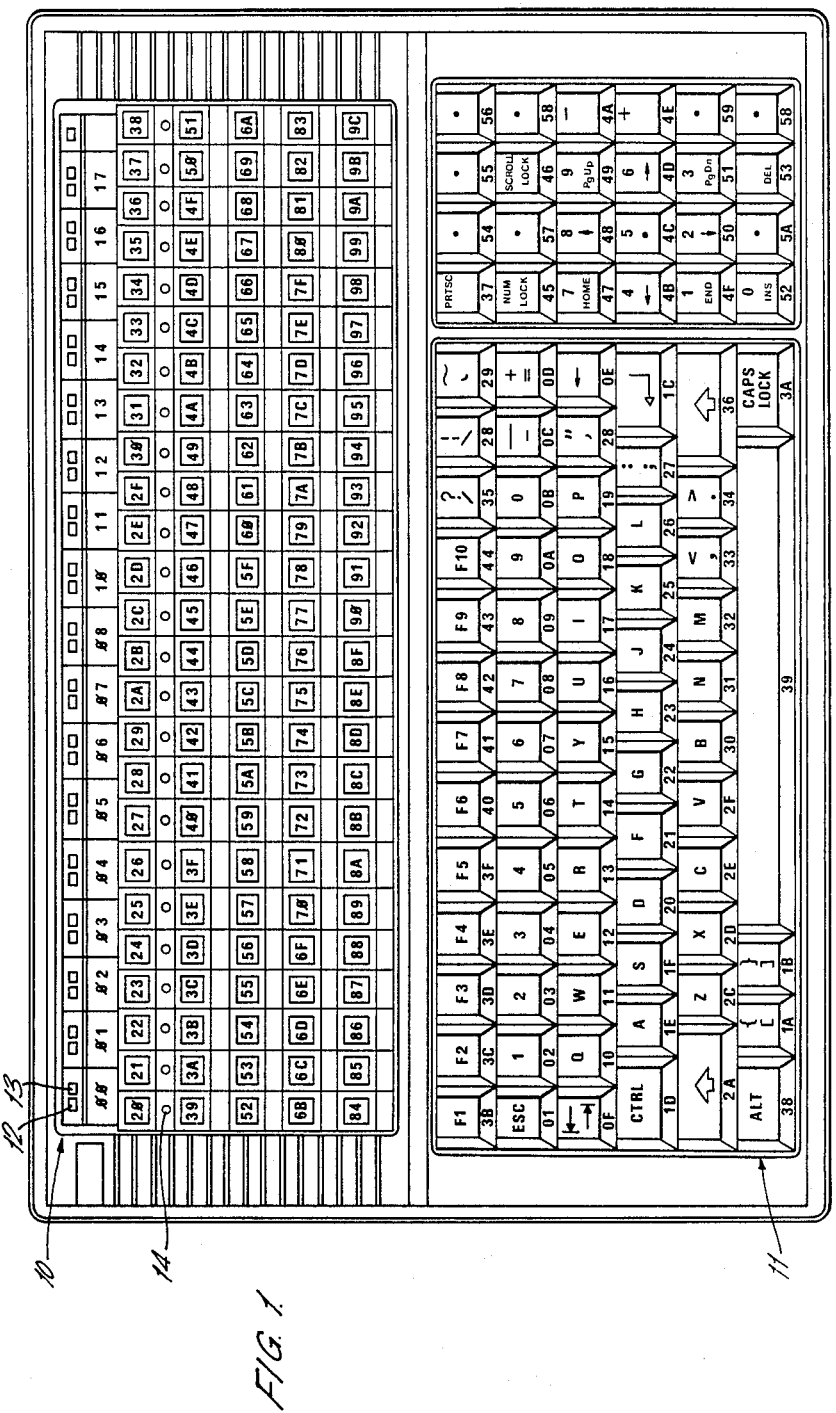

United States Patent [19]

Dowsett et al.

[11] Patent Number: 4,766,418
[45] Date of Patent: Aug. 23, 1988

[54] CONTROL KEYBOARD FOR A MULTIPLE SYSTEM ACCESSING UNIT

[75] Inventors: Derek Dowsett, Near Chertsey; Charles Hodgson, Heath Edn Reach, both of United Kingdom

[73] Assignee: C & P Technology Limited, United Kingdom

[21] Appl. No.: 28,948

[22] Filed: Mar. 23, 1987

[30] Foreign Application Priority Data

Mar. 25, 1986 [GB] United Kingdom ................. 8607348

[51] Int. Cl.$^4$ .............................................. G06F 3/00
[52] U.S. Cl. ................................ 340/365 R; 340/711; 340/365 VL
[58] Field of Search ................... 340/711, 712, 365 R, 340/365 S, 365 VL, 825.56; 364/189

[56] References Cited

U.S. PATENT DOCUMENTS

| 4,385,366 | 5/1983 | Housey, Jr. | 340/365 VL |
| 4,404,551 | 9/1983 | House et al. | 340/711 |
| 4,566,001 | 1/1986 | Moore et al. | 340/365 VL |
| 4,667,307 | 5/1987 | Porcher et al. | 364/189 |
| 4,698,618 | 10/1987 | Liuzzo et al. | 340/368 R |

OTHER PUBLICATIONS

"Keyboard Definition Function", IBM Technical Disclosure Bulletin, vol. 27, No. 5, 10-84, Bradney et al.

Primary Examiner—Gerald L. Brigance
Attorney, Agent, or Firm—Kinney & Lange

[57] ABSTRACT

The Keyboard has two areas of keys each with its own microcomputer control circuit, a first area comprising system selection and associated function keys, and the second area comprising a standard alpha numeric key arrangement. Data deriving from operated keys in the second area is sent by the associated control circuit to the control circuit associated with the first area, from where it is transmitted to the destination identified by the keys operated in the first area. The use of separate control circuits gives the keyboard great flexibility of use while allowing the second area of keys and the associated control circuit to be of conventional type.

9 Claims, 2 Drawing Sheets

CONTROL KEYBOARD FOR A MULTIPLE SYSTEM ACCESSING UNIT

The present invention is concerned with a control keyboard for a multiple system accessing unit.

It may be desirable for a single keyboard operator to have access to several computer based systems. For example, dealing rooms for dealing in currency or commodities are becoming increasingly computerised, with the dealers operating consoles enabling them to call up and display data on one or more visual display units at the console, and further being able to make or confirm transactions by entering appropriate data by means of a keyboard into a central computerised system. In such arrangements, the dealer/operator will require access to data from a number of different computerised data sources which provide specialist data on line. A problem arises because commonly each of the computerised data bases may require different data communication protocols to enable proper access to the required data, and may further supply the data in different formats. It has therefore on occasion been necessary to provide the dealer/operator with separate keyboards and visual display units for each of the data bases to which he requires to have access. This clearly leads to excessive crowding of the dealer/operators working area both with the keyboards and VDU's themselves and also with the electronic hardware associated with each system enabling the system to communicate, e.g. over telephone lines, with the remote data base.

Recent developments have gone some way to resolving this problem by providing central communication switching and exchange units located in a room separate from the dealing room and with which the dealer/operator can communicate using one or more keyboards at the console. Such central switching and exchange units themselves contain the necessary electronics to set up data links with desired remote data bases and also themselves to provide the necessary drive outputs to drive one or more visual display units at the dealing position. It is also known for the dealer/operator to have a single composite keyboard which will provide the usual basic or standard alpha numeric function keys and additionally separate sets of special function keys appropriate to each of a number of different data bases to which he requires access.

However, existing keyboard design has severely limited the level to which this development can be taken. Normal keyboards typically communicate using a standard set of codes for the various keys on the keyboard (for example the ASCII code). This limits the total number of keys which can be assigned a different code. It will be appreciated that the composite keyboard referred to above requires not only the usual alpha numeric key set but also several sets of function keys, with one set dedicated to each of the systems or data bases to which the operator is to have access.

Existing keyboard designs typically employ a single microprocessor based control circuit which scans through each of the keys in turn to detect when any key is depressed, then generates the appropriate code for that key and arranges for that code to be sent from the keyboard to the attached computer system. Composite keyboards used hitherto for accessing and controlling any selected one of several data bases or systems have been made using these known existing keyboard manufacturing techniques. However substantial difficulties arise in using these known techniques to make a keyboard capable of providing separate selection and function keys for large numbers of different selectable systems. For example in the dealing room environment it may be desirable for the keyboard to be able to access and control 10 or more different systems or data bases, therefore requiring one select key and a set of function keys for each of these 10 or more systems.

The present invention is concerned with providing an improved keyboard design which facilitates the provision of such additional system select and associated function key sets. Whereas the proposed new keyboard design, the subject of this invention, is applicable in the financial/commodity dealing environment discussed in the above example, it may additionally have application wherever a single keyboard can desirably be used to control a multiple system accessing unit enabling access to and control of any one of several selected computer based systems or data bases. Additional applications include applications in telecommunications, in process control systems, in computer aided design systems, simulation systems, airline flight or hotel booking systems or telemetry control.

According to the present invention, a control keyboard for a multiple system accessing unit comprises a first keyboard area including system select keys and respective groups of associated function keys for each of the selected systems; a first microcomputer control circuit arranged to scan the keys of said first keyboard area to detect depression of a key in said first area; a second keyboard area including standard alpha numeric keys; a second microcomputer control circuit arranged to scan the keys of said second keyboard area to detect depression of a key in said second area; a data communication port for sending digital data to the multiple system accessing unit; and a data bus and control lines interlinking said first and second control circuits and said port; the first control circuit responding to detection of a depressed key in said first area by generating a code word identifying the depressed key and transmitting data including the code word over the data bus to said port for sending to said accessing unit; the second control circuit responding to detection of a depressed key in said second area by generating a code word identifying the depressed key and further sending a code word ready flag to the first control circuit; the first control circuit having an additional function of responding to the code word ready flag from said second control circuit by enabling the second control circuit to apply the code word to the data bus, reading the applied code word from the data bus and then transmitting data including said code word from the second control circuit over the data bus to said port for sending to said accessing unit.

With this arrangement separate microcomputer control circuits are employed for scanning the keys of the first and second keyboard areas. The primary microcomputer control circuit is the first control circuit which scans the first keyboard area containing the system select and associated function keys. Data identifying depressed keys in the second area is prepared by the second microcomputer control circuit but is then passed to the first control circuit before being sent by the first control circuit to the system accessing unit via the communication port. This arrangement permits the second keyboard area which contains the standard alpha numeric keys to be based on a standard keyboard system with its associated electronics which will constitute the second microcomputer control circuit. By providing an additional microcomputer control circuit (the first control circuit) for scanning the select and function keys, the particular arrangement of such keys and the distribution of identity codes for such keys can be rendered much more flexible, since it is no longer necessary to alter the electronic control circuit employed for scanning the standard alpha numeric keys.

Preferably, each of the system select keys of said first keyboard area has a characteristic enabling it to be visually distinguished from the other system select keys, and the keys of each group of associated function keys each has the same characteristic as its associated system select key, whereby on depressing a system select key to select a desired system the function keys associated with the selected system are readily visually identifiable. Very conveniently, the common characteristic of each system select key and its group of associated function keys is a unique colour.

Preferably said data communication port is a two-way port for transmitting data to or receiving data from said multiple system accessing unit, and the port is arranged to respond to receipt of data from said accessing unit by sending a data ready flag to said first control circuit, the first control circuit having an additional function of responding to the data ready flag by enabling the port to apply the received data to the data bus and then reading the applied data from the bus. With this arrangement the keyboard may conveniently include light emitting diodes (LEDs) associated with keys of said first key area, the first control circuit being responsive to control data received from said accessing unit via the communication port to illuminate and extinguish designated ones of said LEDs.

The provision of these LEDs is highly advantageous. For example each of the system select keys may be provided with an LED which is illuminated on selection of the respective system. It will be noted that illumination of an LED involves the intervention of the accessing unit. When a system select key is depressed, the code for that key is sent via the communications port to the accessing unit. The accessing unit would respond not only by setting up the necessary conditions to provide access to the selected system but also by sending back to the keyboard the appropriate control data to cause illumination of the LED on the depressed system select key.

In a preferred arrangement, each of the system select keys has two associated LEDs. Then one of the two LEDs may be illuminated as described above to show the system which has been selected and the other may be illuminated for example to show that the system in question is available. Thus if all selectable systems are available, the accessing unit sends codes to illuminate all the availability indicating LEDs for the different system select keys. However the selected LED for a particular key is only illuminated on selection of the corresponding system.

It is further preferably for the keyboard to include at least one auxiliary two-way data communication port, in addition to the aforementioned port (the main port), linked to the data bus and control lines and operable in the same manner as the main port, the first control circuit having additional functions of passing data from said auxiliary port to said main port for sending to the accessing unit, and, in response to address data and information data received from the accessing unit via the main port, of passing the information data to the auxiliary port as designated by the received address data. With this facility additional devices and apparatus may be connected to the keyboard. The first control circuit in the keyboard provides for appropriate control of data transfer between any devices connected to the auxiliary ports and the accessing unit via the main port. This facility may be used for example to connect a known additional computer input device to the keyboard, such as a graphics tablet or a mouse, or alternatively to connect the keyboard to a local personal computer. In the latter example the system accessing unit may be arranged to treat the personal computer connected to the keyboard as one of the systems selectable by the system accessing unit. Then on selecting the personal computer on the keyboard, subsequent key strokes from the keyboard are identified in the system accessing unit and translated as necessary, and then returned to the keyboard designated for transmission through the respective auxiliary port to the personal computer to control the computer. In this way the keyboard may on appropriate system selection, operate as the control keyboard for the personal computer.

With this arrangement, it is convenient for the first control circuit in the keyboard to be arranged to generate an identity code identifying the source of data to be transmitted by the first control circuit to the main port for onward sending to the accessing unit, that is identifying whether the data is a code word identifying a depressed key in said first keyboard area or is data received via the auxiliary port or a designated one of several auxiliary ports, and the first control circuit may then further be arranged to transmit the identifying code to the main port for onward sending to the accessing unit immediately prior to transmitting the data itself. In this way the accessing unit may receive two bytes of information, the first identifying the source of the immediately following byte of data.

In a convenient embodiment, the first control circuit has interrupt means and is arranged to perform said scanning of the keys of the first keyboard area and any said responsive generating of a code word and transmitting of data to said port continuously unless interrupted by said interrupt means, any of the above referred additional functions of said first control circuit being performed in response to an interrupt signal causing said interrupt means to interrupt the first control circuit.

Figure 2:
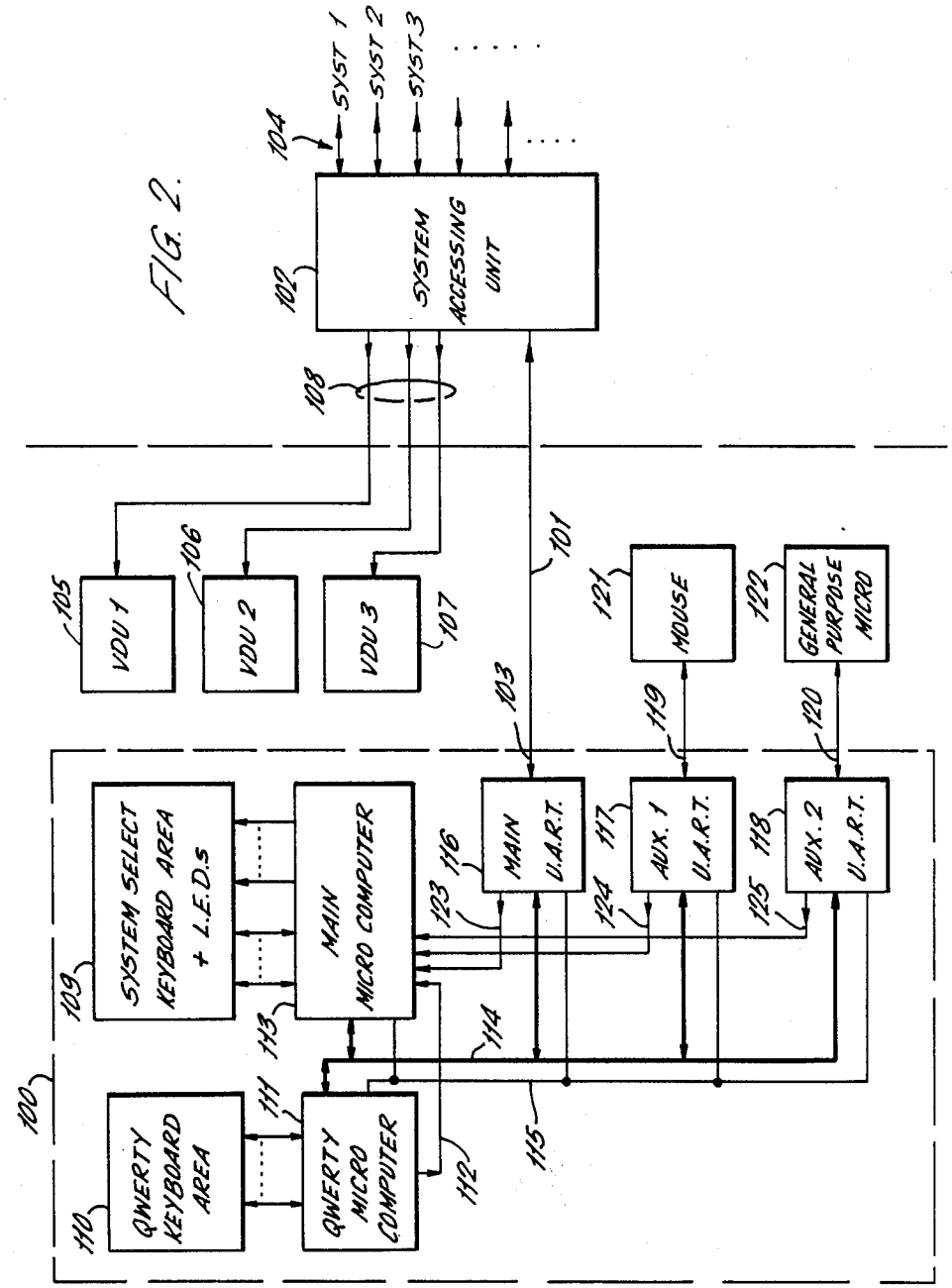

An example of the present invention will now be described with reference to the accompanying drawings in which:

FIG. 1 is a plan view of a keyboard embodying the present invention showing the layout of keys; and FIG. 2 is a block schematic diagram of the electronic system of the keyboard together with the system accessing unit and additional peripheral units to which the keyboard may be connected.

FIG. 1 is a plan view of a keyboard showing the layout of keys. It will immediately be apparent that the total number of keys provided on the keyboard is very much greater than for typical keyboards used hitherto for controlling computers or in communication equipment. The keys on the keyboard are divided into two groups. The upper group indicated generally at 10 in the Figure, constitute system select and associated function keys and corresponds to the first group of keys referred to previously herein. The lower group identified generally at 11 comprise the standard alpha numeric keys typically found on ordinary keyboards and corresponds to the second group of keys referred to previously herein.

The second group 11 of keys includes letter keys in the typical "Qwerty" layout, together with the usual additional keys for numerals, punctuation, shift, backspace, space, caps lock, etc. The group additionally includes along the top line of the group 11 a small set of basic function keys such as are commonly found with computer control keyboards, together with the usual ESCAPE key at the left hand end of the second row.

In addition the group 11 comprises on the right hand side a separate set of numeral keys together with basic arithmetic keys and some function keys for controlling standard display functions. All the keys in the group 11 correspond to keys which are commonly found in standard computer control keyboards and indeed this portion of the present keyboard may be made employing the base plate, key mechanisms, layout and key caps, together with a scanning electronics of a standard existing keyboard.

The upper group 10 illustrated in the Figure comprises five rows each of 25 keys, together with an additional top row of 18 keys. The 125 keys in the 5 rows of 25, together with the right hand key of the top row all have a standard size. However the remaining 17 keys of the top row are one and a half times the width of the other keys. The 17 one-and-a-half width keys of the top row constitute the system select keys of the first group of keys, and the 125 keys of the five rows below comprise the various sets of function keys which may be associated with each of the selected systems.

The keys of group 10 are colour coded so that each of the system select keys of the top row capable of selecting a different system has a unique colour, and the set of function keys associated with each such system select key has the same colour. In practice not all the 17 system select keys may be operable in any particular application of the keyboard. Keys which are surplus to requirements may all be coloured black, for example. In one arrangement, there may be only five selectable systems which may be selected by depressing system select keys 06, 07, 08, 10 or 11. System select key 06 may be coloured red. The specialist function keys for the system selected by key 06 may be provided along the bottom row of the keys in the group 10, i.e. the keys identified 84, 85 . . . 9C. Then all this bottom row of keys may also be coloured red so that it is immediately visually apparent to the operator that the bottom row keys are the function keys for that selected system.

Similarly, the select key 07 may be coloured brown and the middle row of the function keys, i.e. keys identified 52, 53 . . . 6A may also be coloured red. Select key 08 may be coloured blue and the second row of function keys, identified 39, 3A . . . 51 may also be coloured blue. Select key 10 may be coloured green and the top row of function keys, identified 20, 21 . . . 38 may also be coloured green. Select key 11 may be coloured yellow and the fourth row of function keys, identified 6B, 6C . . . 83 may also be coloured yellow.

The operation of the keyboard in association with equipment to which it is connected will be described in more detail later, whereupon the advantages of this colour coding will become more apparent.

Each of the one-and-a-half width system select keys in the upper most row of the group 10 is provided with two separate light emitting diodes, e.g. diodes 12 and 13 of key identified 00. Again the purpose and function of these LEDs will be described later herein. Additional LEDs may be provided for other keys of the first group 10. In the example illustrated the entire top row of function keys, identified 20, 21 to 38, has one LED each, e.g. at 14.

It will be appreciated that the keyboard illustrated in FIG. 1 will have at least one and preferably two or three connection sockets for interconnecting the keyboard with the equipment it is to control. These connection sockets are not shown in FIG. 1 but may be of standard design. Each connection socket may constitute one port of the keyboard and may additionally provide for the power for the electronics in the keyboard to be supplied from the equipment to which the keyboard is connected.

Referring now to FIG. 2, a functional block diagram of the electronic components contained in the keyboard is illustrated within the dotted outline box 100. As illustrated, the keyboard 100 is interconnected by a cable 101 with a system accessing unit 102. The cable 101 may be connected to the keyboard 100 using one of the connection sockets referred to above. One such socket is designated as the main port 103 of the keyboard to which the system accessing unit 102 should be connected.

The keyboard 100 controls the system accessing unit 102 to provide access as desired to a selected one of a number of different computer based systems. The system accessing unit can set up data communication paths, such as paths 104 with a number of different computer based systems, e.g. identified as SYST 1, SYST 2 and SYST 3, etc. in the drawing. The various remote systems with which the system accessing unit 102 can communicate may be a number of different remote computer based data bases, for example or alternatively various computer based services, typically accessed over telephone lines, or special data links. The present invention is equally applicable to any application where it is required for a single operator employing the keyboard of the present invention to have access to any one of several such remote systems. However a particular example is in financial or commodity dealing rooms where the dealers may require to access remote data bases or services such as Reuters Monitor, Reuters Dealing, Reuters Quotation, Telerate (AP Dow Jones), FBI, RMJ, Garban, Cantor Fitzgerald, Market View, Track Data, Reuters RTF, Telerate SOP, Topicline, Life, Viewdata and Aregon.

In the dealing room arrangement, the dealer who operates the keyboard may work at a console including the keyboard and two or three visual display units, such as VDUs 105, 106 and 107 in the drawing. These VDUs also are controlled from the system accessing unit 102 by signals on cables 108. Accordingly, the system accessing unit can set up a communication path with any one of a number of different systems as selected by commands from the keyboard 100, employing the appropriate protocols required by the selected system, and can then, again subject to commands from the keyboard 100, call up data from the system, assemble this and provide for its display on one of the VDUs 105, 106 and 107. To the dealer/operator using the keyboard 100, it appears as though he has direct access to the selected system.

In order to command the system accessing unit 102 to provide access to a selected system, the dealer/operator depresses one of the system select keys on the top most row of the group 10 of keys as illustrated in FIG. 1. Once the system accessing unit has indicated, e.g. by illuminating an LED associated with the respective system select key, that the selected system is now available, the dealer/operator may control the acquisition of data from that system in the usual way employing the associated group of specialist function keys for the selected system, together with the usual alpha numeric keys of the lower, second group 11 on the keyboard.

Looking now at the electronic architecture of the keyboard 100, the switches associated with the first group of keys, group 10 in FIG. 1, together with their associated LEDs are represented by block 109. The second group of keys, group 11 in FIG. 1, is represented by the block 110. The switches associated with the keys in the second group, the qwerty keyboard area 110, are continuously scanned by a microcomputer 111 to determine when any key of the qwerty area is depressed. It is common practice with keyboards to arrange the key switches in a matrix of rows and columns and to scan these switches, e.g. row by row, to determine any depressed keys in the currently scanned row. Any particular depressed key can thus be identified and the microcomputer responds by generating a unique identity code for that key.

In prior art keyboards, the microcomputer 111 responsible for scanning the keys of the keyboard would, on generating the code of a depressed key, promptly arrange for this code to be transmitted to the computer or other device that the keyboard was controlling. However in the present keyboard, the microcomputer 111 having prepared a code word representing the identity of a depressed key in the qwerty keyboard area 110 then generates a code word ready flag which may take the form of an interrupt signal on interrupt line 112.

The keyboard 100 includes a further main microcomputer 113. The microcomputer 113 is arranged to scan through the switches associated with the keys in the system select keyboard area 109 again to identify any depressed key and to generate a code word identifying any such key. Both the main microcomputer 113 and the "qwerty" microcomputer 111 are linked by a common data bus 114 as well as control lines which may take the form of a control bus 115. The keyboard 100 additionally includes 3 Univeral Asynchronous Receiver/Transmitters (UARTs) 116, 117 and 118. Each of the UARTS 116, 117 and 118 are also linked to the data bus 114 and control bus 115. UART 116 is designated the "main" UART and UARTs 117 and 118 are auxiliary UARTS. Each UART is capable of communicating with external equipment connected to the keyboard via an associated port. The port associated with the main UART 116 is the port 103 by which this keyboard is connected by cable 101 to the system accessing unit 102. Ports 119 and 120 associated with the auxiliary 117 and 118 may be connected to additional local peripheral or computer equipment such as a "mouse" 121 shown connected to UART 117 or a general purpose microcomputer 122 shown connected to UART 120.

Each of the UARTs 116, 117 and 118 can both send and receive data through its associated port. If the main UART 116 receives data from the system accessing unit 102 this data is held in a buffer in the UART and the UART sets an interrupt signal on an interrupt line 123. Similarly the auxiliary UARTs 117 and 118 respond to reception of data by setting interrupts on respective interrupt lines 124 and 125.

Each of the interrupt lines 112, 123, 124 and 125 are fed to interrupt inputs of the main microcomputer 113.

In operation, the main microcomputer, in the absence of an interrupt on any of its interrupt lines, continuously scans the switches associated with the keys in the system select keyboard area. On identifying a depressed key in this area, the unique code for that key is generated by the computer 113 and the computer then sends this data via the data bus 114 to the main UART 116 for transmission on cable 101 to the system accessing unit 102. The data is sent as two data bytes. The first byte comprises an identification byte which identifies the following data byte which is immediately to follow as an identity code for a depressed key in the system select keyboard area. The second data byte is the key ident code itself.

In order to send the two bytes of data, the microcomputer applies each byte in turn to the data bus 114 and then enables the input buffer of the main UART 116 by appropriate control signals on the control bus 115. The UART 116 then sends the data in the usual way over the cable 101 to the system accessing unit 102.

In the event of an interrupt signal on interrupt line 112 from the "qwerty" microcomputer 111, the main microcomputer 113 interrupts its scanning of the key switches of the system select keyboard area 109, and instead enables the microcomputer 111, by means of control signals on the control bus 115, to apply the data word representing the depressed key in the qwerty keyboard area 110 on to the data bus 114. The main microcomputer 113 then reads this data word from the data bus and immediately retransmits it over the data bus 114 to the main UART 116. The main microcomputer 113 may additionally be arranged to provide an identification byte prefacing the transmission of the data byte identifying a depressed qwerty key. However, in one arrangement the system accessing unit 102 is programmed so that data which is not so prefaced by an identity byte is assumed to be coming from the qwerty microcomputer 111 and to represent a depressed qwerty key.

As mentioned above, the system select keyboard area includes a number of LEDs associated with various other keys. The illumination and extinguishing of these LEDs is controlled by data received from the system accessing unit 102. On receipt of such data by the main UART 116, the UART generates an interrupt signal on the interrupt line 123. The main microcomputer 113 responds to this interrupt by enabling the UART 116 to apply the received data byte to the data bus 114, and reading this data from the data bus.

Apart from instructions to illuminate selected LEDs in the keyboard area 109, data may be received from the system accessing unit for transfer via one of the auxiliary UARTS 117 and 118 to equipment connected to the keyboard via the associated port 119 or 120. This is also handled under the control of the microcomputer 113.

The system accessing unit 102 is arranged to preface each data byte sent to the main UART 116 by an address byte. The main microcomputer 113 responds to the received address byte by directing the following data byte to the appropriate addressee. For example there may be separate address codes for each of the auxiliary UARTS 117 and 118 and also separate address codes indicating that the following data is identifying an LED to be turned on, or alternatively indicating that the following data byte identifies an LED to be turned off. On receiving one of these address bytes for turning an LED on or off, the main microcomputer 113 directs the following data byte to a decoding circuit which is encompassed within the block 113 in the Figure. The decoding circuit decodes the received data to identify the LED to be turned on or off in accordance with the preceding address byte.

In constructing the keyboard 100 the qwerty keyboard area 110 with its associated matrix of key switches, together with the qwerty microcomputer 111 may be formed on one single printed circuit board, or possibly two interlinked circuit boards in some examples. The design of this circuitry may be taken from existing prior art designs for controlling known qwerty type keyboards. The various switches associated with the the system select and function keyboard area 109 may themselves be formed on a further printed circuit board which also carries the light emitting diodes for the keys. Furthermore this circuit board may include the required drivers for the light emitting diodes. The main microcomputer 113 and its associated control and decoding circuitry and also the UARTS 116, 117 and 118 may all be provided on one further main logic board. This main logic board is connected to the board carrying the system select key switches and their associated LEDs by sufficient lines to provide not only for the scanning of the switches but also to control each individual LED.

In summary, the described keyboard provides in a very efficient and convenient manner, a composite keyboard having not only the usual alpha numeric keys but also a large number (143 in the described example) of additional system select and function keys. Codes identifying the depression of any of these keys are sent to the system accessing unit to control appropriate operations. The design enables existing types of alpha numeric keyboards to be incorporated in the composite keyboard without completely reprogramming or designing their associated electronics. Additionally, the main microcomputer 113 in the present design enables active control of a large number of light emitting diode indicators on the system select key area and also provides for two-way data communication between the system accessing unit and additional equipment connected through either of the auxiliary ports.

We claim:

1. A control keyboard for a multiple system accessing unit, the keyboard comprising
    a first keyboard area including system select keys and respective groups of associated function keys for each of the selectable systems;
    a first microcomputer control circuit arranged to scan the keys of said first keyboard area to detect depression of a key in said first area;
    a second keyboard area including standard alpha numeric keys;
    a second microcomputer control circuit arranged to scan the keys of said second keyboard area to detect depression of a key in said second area;
    a data communication port for sending digital data to the multiple system accessing unit;
    and a data bus and control lines interlinking said first and second control circuits and said port;
    the first control circuit responding to detection of a depressed key in said first area by generating a code word identifying the depressed key and transmitting data including the code word over the data bus to said port for sending to said accessing unit;
    the second control circuit responding to detection of a depressed key in said second area by generating a code word identifying the depressed key and further sending a code word ready flag to the first control circuit;
    the first control circuit having an additional function of responding to the code word ready flag from said second control circuit by enabling the second control circuit to apply the code word to the data bus, reading the applied code word from the data bus and then transmitting data including said code word from the second control circuit over the data bus to said port for sending to said accessing unit.

2. A control keyboard as claimed in claim 1 wherein each of the system select keys of said first keyboard area has a characteristic enabling it to be visually distinguished from the other system select keys, and the keys of each group of associated function keys each has the same characteristic as its associated system select key, whereby on depressing a system select key to select a desired system the function keys associated with the selected system are readily visually identifiable.

3. A control keyboard as claimed in claim 2 wherein the characteristic common to each system select key and its group of associated function keys is a unique colour.

4. A control keyboard as claimed in claim 1 wherein said data communication port is a two-way port for transmitting data to or receiving data from said multiple system accessing unit, and the port is arranged to respond to receipt of data from said accessing unit by sending a data ready flag to said first control circuit, the first control circuit having an additional function of responding to the data ready flag by enabling the port to apply the received data to the data bus and then reading the applied data from the bus.

5. A control keyboard as claimed in claim 4 and including light emitting diodes (LEDs) associated with keys of said first keyboard area, the first control circuit being responsive to control data received from said accessing unit via the communication port to illuminate and extinguish designated ones of said LEDs.

6. A control keyboard as claimed in claim 5 wherein each of the system select keys has two associated LEDs.

7. A control keyboard as claimed in claim 4 including at least one auxiliary two-way data communication port, in addition to the aforementioned main port, linked to the data bus and control lines and operable in the same manner as the main port, the first control circuit having additional functions of passing data from said auxiliary port to said main port for sending to the accessing unit, and, responsive to address data and information data received from the accessing unit via the main port, of passing the information data to the auxiliary port as designated by the received address data.

8. A control keyboard as claimed in claim 7 wherein the first control circuit is arranged to generate an identity code identifying the source of data to be transmitted by the first control circuit to the main port for onward sending to the accessing unit, that is identifying whether the data is a code word identifying a depressed key in said first keyboard area or is data received via the auxiliary port or a designated one of several auxiliary ports, and the first control circuit is further arranged to transmit the identifying code to the main port for onward sending to the accessing unit immediately prior to transmitting the data itself.

9. A control keyboard as claimed in claim 1 wherein the first control circuit has interrupt means and is arranged to perform said scanning of the keys of said first keyboard area and any said responsive generating of a code word and transmitting of data to said port, continuously unless interrupted by said interrupt means, any of the above referred additional functions of said first control circuit being performed in response to an interrupt signal causing said interrupt means to interrupt the first control circuit.

* * * * *